United States Patent [19]

Utsunomiya

[11] 4,007,426
[45] Feb. 8, 1977

[54] F-M DEMODULATOR CIRCUIT

[75] Inventor: Kimitake Utsunomiya, Tokyo, Japan

[73] Assignee: Sony Corporation, Tokyo, Japan

[22] Filed: June 13, 1975

[21] Appl. No.: 586,730

Related U.S. Application Data

[63] Continuation-in-part of Ser. No. 427,317, Dec. 21, 1973, abandoned.

[30] Foreign Application Priority Data

Dec. 21, 1972 Japan .......................... 47-128446

[52] U.S. Cl. .......................... 329/103; 331/113 R
[51] Int. Cl.² ........................................ H03D 3/14
[58] Field of Search .......... 329/102, 103, 123, 104, 329/122; 332/14; 331/113 R

[56] References Cited

UNITED STATES PATENTS

| 3,518,575 | 6/1970 | Cottatellucci | 332/14 |
|---|---|---|---|
| 3,681,702 | 8/1972 | Dann | 329/122 |
| 3,811,097 | 5/1974 | Dijkmans | 332/14 |
| 3,855,551 | 12/1974 | Ishigaki | 332/14 |
| 3,902,140 | 8/1975 | Grebene | 332/14 |

Primary Examiner—John Kominski
Attorney, Agent, or Firm—Lewis H. Eslinger; Alvin Sinderbrand

[57] ABSTRACT

An F-M demodulator circuit including a multivibrator and a differential amplifier that have common output electrodes and a capacitor thereacross demodulates a frequency modulated signal differentially applied to input electrodes of the amplifier. The state of conductivity of the multivibrator reverses at a fixed time after reversal of the state of conductivity of the differential amplifier. The capacitor is charged to opposite polarities alternately, according to the relative states of conductivity of the multivibrator and differentially amplifier, by constant current pulses of equal duration. A pulse signal based on the rate of occurrence of the charging pulses has a duty cycle linearly related to the frequency of the modulating signal, and filtering this pulse signal extracts the modulating signal.

8 Claims, 10 Drawing Figures

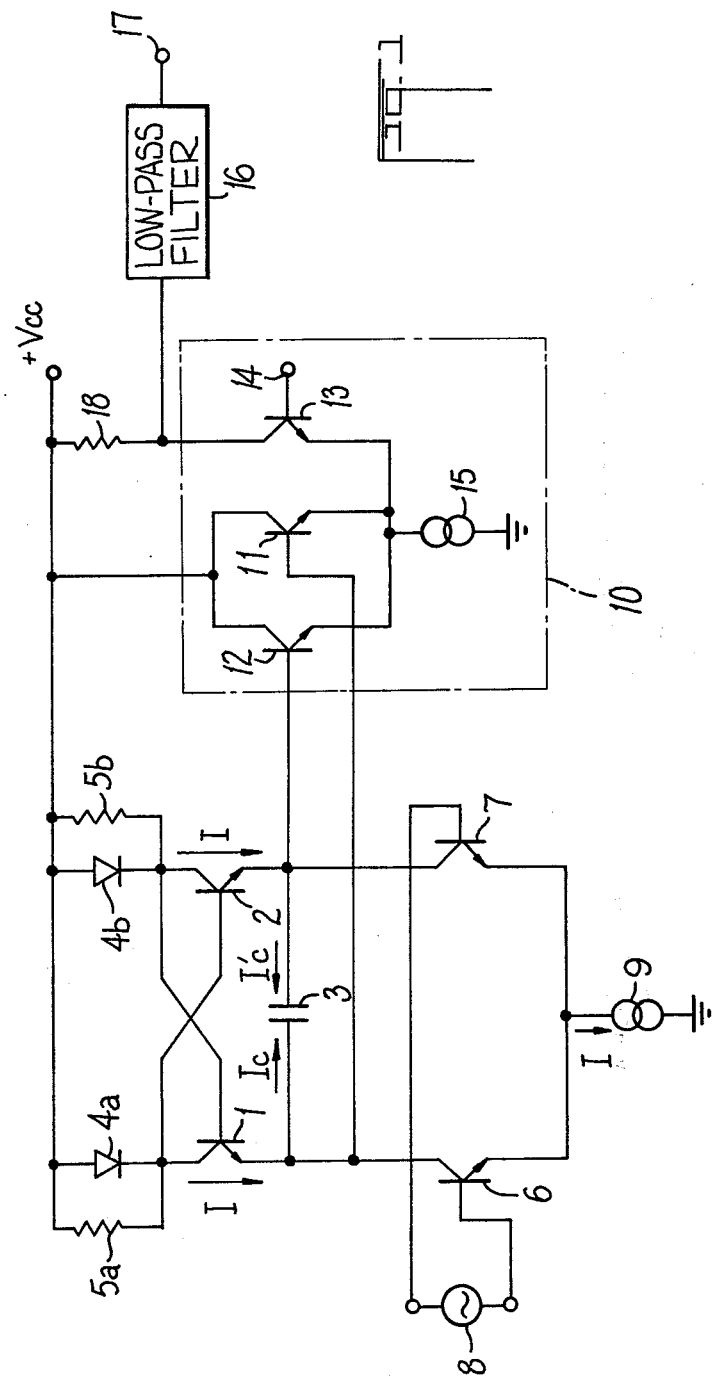

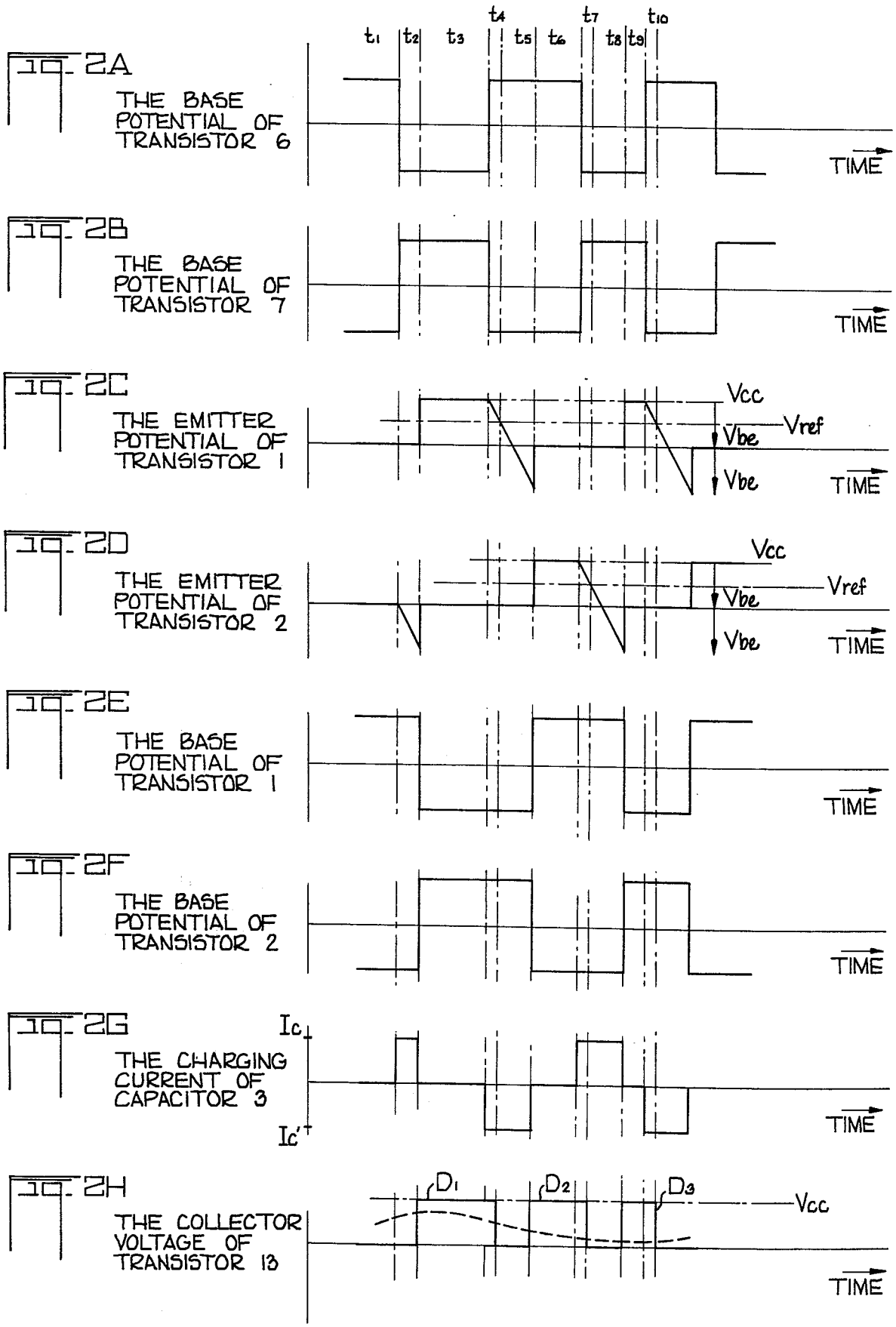

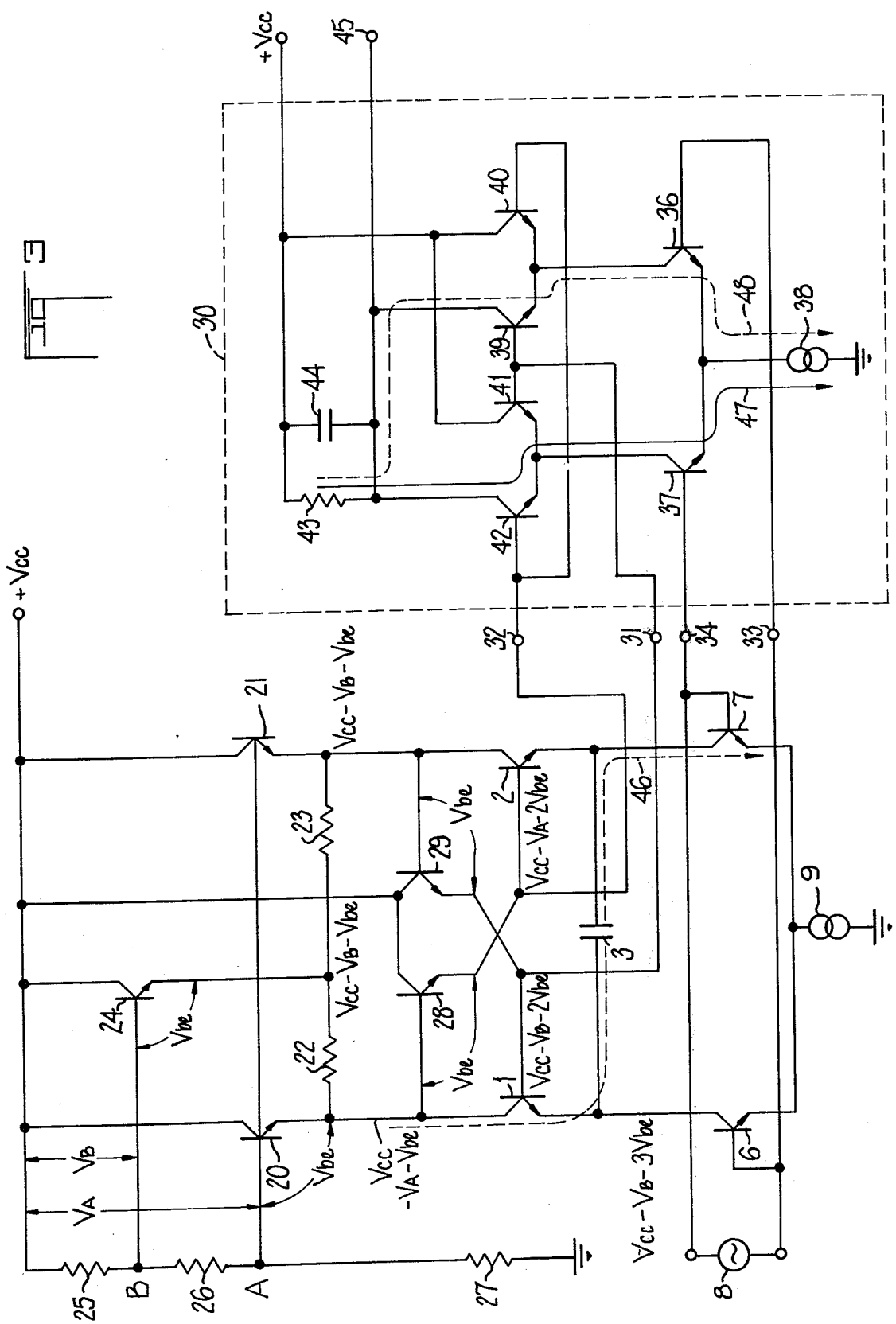

F-M DEMODULATOR CIRCUIT

This application is a continuation-in-part of Applicant's copending application Ser. No. 427,317, filed Dec. 21, 1973 and now abandoned.

BACKGROUND OF THE INVENTION

1. Field of the Invention

This invention relates to an F-M demodulator circuit and, in particular, to a phase detector type of demodulator that may be readily fabricated in integrated circuit configuration.

2. The Prior Art

Generally, conventional F-M demodulator circuits of the type that find application in video tape recording devices have usually been of either the pulse counter type, the delay line type, or the phase detector type.

In the pulse counter type of F-M demodulator circuit, a frequency modulated signal is usually transformed into a rectangular wave by, for example, a limiting circuit, and the rectangular wave is then differentiated to derive a pulse signal having a period representative of the frequency of the F-M signal. An output signal representing the frequency variations may be derived by supplying the resultant pulse signal to an integrating circuit, such as a low pass filter, via a bidirectional rectifying circuit.

Unfortunately, this pulse counter type of demodulator suffers from the disadvantage of a limited frequency response due to the differentiating circuit. As a result, the derived output signal will have a linear relationship with respect to the frequency variations of the F-M signal over a wide range of frequencies. Another disadvantage is that an error voltage might be superposed onto the output signal if the frequency modulated signal suffers from amplitude variations. A still further disadvantage is that the differentiating circuit generally is not readily adaptable for integrated circuit fabrication.

In the delay line type of F-M demodulator circuit, the frequency modulated signal is generally applied to a mixer circuit through a direct conducting channel and through a time-delay channel including the delay line. The mixer circuit is adapted to respond to the signals applied thereto to produce an output pulse signal having a duty ratio determined by the phase difference between the signals applied to the mixer circuit. A demodulated output signal is then obtained by integrating the produced output pulse signal.

However, the delay line type of demodulator generally suffers from many of the same disadvantages as the pulse counter type of demodulator. That is, the limited frequency response of the delay line generally limits the frequency range over which the demodulated output signal has a linear relationship with respect to the frequency variations of the F-M signal. Also, amplitude variations in the frequency modulated signal often induce error voltages in the output signal. Additionally, the delay line is generally not adapted for integrated circuit configuration.

OBJECTS OF THE INVENTION

It is one object of the present invention to provide an improved F-M demodulator circuit of the phase detector type.

It is a further object of the present invention to provide a linear F-M demodulator circuit wherein the demodulated output signal has a linear relationship with respect to the frequency variations in the F-M signal over a wide frequency range.

Yet another object of the present invention is to provide an F-M demodulator circuit wherein the phase difference between the F-M signal frequency and an oscillating signal frequency is detected to derive a demodulated output signal.

A still further object of this invention is to provide an F-M demodulator circuit that can readily be fabricated as an integrated circuit.

SUMMARY OF THE INVENTION

In accordance with the present invention, the F-M demodulator circuit includes an emitter-coupled multivibrator having a capacitor in the emitter coupling circuit and a differential amplifier that has its output terminals coupled to the multivibrator. The frequency modulated signal is differentially applied to the input terminals of the differential amplifier causing an output signal having a pulse interval that is proportional to the phase difference between the frequency modulated signal and the oscillating signal produced by the multivibrator to be produced at the output terminals of the differential amplifier. The phase difference is linearly related to the frequency of the frequency modulated signal.

In one embodiment output signal pulses from the two terminals of the capacitor are applied to parallel-connected input transistors of a bidirectional rectifier, or second differential amplifier. A reference voltage is applied to a third transistor differentially connected with respect to the input transistors, and the third transistor is made non-conductive as long as pulse signals applied to either of the input transistors are more positive than the reference voltage. This generates a series of pulses at the collector of the third transistor, and the duration of each of these pulses is a linear function of the modulating frequency of the F-M signal. The variable-duration pulses are passed through a low-pass filter to complete the demodulation of the F-M signal.

In another embodiment, the voltage to which the capacitor is charged is controlled by a circuit connected to the two sections of the multivibrator to balance out changes that might occur in the charging voltage due to thermal effects on the transistors.

The frequency-modulated signal and a pulse signal from the multivibrator may be applied to separate sets of differential input terminals of a multiplying circuit to produce an output pulse each time the frequency modulated signal and the multivibrator signal make a selected one of their respective sets of input terminals positive. The output pulses can then be filtered to complete the demodulation.

BRIEF DESCRIPTION OF THE DRAWINGS

The invention will be more clearly understood by reference to the following detailed description of certain exemplary embodiments thereof in conjunction with the accompanying drawings in which:

FIG. 1 is a schematic diagram of one embodiment of an F-M demodulator circuit in accordance with the present invention;

FIGS. 2A-2H are graphical representations of various waveforms produced by the circuit components schematically illustrated in FIG. 1; and FIG. 3 is a schematic diagram of another embodiment of the F-M demodulator circuit in accordance with the present invention.

DETAILED DESCRIPTION OF CERTAIN ONES OF THE PREFERRED EMBODIMENTS

Referring now to the drawings and in particular to FIG. 1, there is schematically illustrated an F-M demodulator circuit comprising an emitter-coupled multivibrator circuit and a differential amplifier. The multivibrator circuit includes two transistors 1 and 2, each having base, collector and emitter electrodes. In the example shown, the transistors are NPN transistors, but it will be readily understood that any other type of transistor, such as a PNP transistor, may be used. The transistors 1 and 2 are cross-coupled so that the base electrode of each is connected to the collector electrode of the other. In addition, a capacitor 3 is connected in series between the emitter electrodes of the transistors. The collector electrode of transistor 1 is also coupled to a source of energizing potential $+V_{cc}$ by a parallel circuit comprised of a diode 4a and a resistor 5a. The diode is polarized to carry current from the energizing source in the same direction as the collector-emitter circuit in the transistor 1. The collector electrode of the transistor 2 is similarly connected to the source $+V_{cc}$ by a parallel circuit consisting of a diode 4b and a resistor 5b, the latter diode being polarized to carry current in the same direction as the collector-emitter current in the transistor 2.

The differential amplifier includes two transistors 6 and 7 having their emitter electrodes connected directly together to one terminal of a constant current source, the other terminal of which is connected to a reference potential, such as ground potential. The transistors 6 and 7 are shown as NPN transistors but any other type of transistor may be used with suitable change in circuit polarities. The collector electrode of the transistor 6 is directly connected to the emitter electrode of the transistor 1 and the collector electrode of the transistor 7 is directly connected to the emitter electrode of the transistor 2. A source 8 of suitable F-M signals is connected differentially to the base electrodes of the transistors 6 and 7.

The emitter electrodes of the multivibrator further are connected to a circuit 10, which may be referred to as a bidirectional rectifier circuit. This circuit comprises transistors 11–13 and a constant current circuit 15. The base of the transistor 11 is connected to the emitter electrode of the transistor 1, and the base of the transistor 12 is connected to the emitter electrode of the transistor 2, and the collector and emitter electrodes of the transistors 11 and 12 are connected together, respectively, so that the collector-emitter circuits of these two transistors are connected in parallel between the source $+V_{cc}$ and the constant current source 15. The base of the transistor 13 is connected to a reference terminal 14 supplied with a DC reference potential, the collector is connected by a load resistor 18 to the source $+V_{cc}$, and the emitter is connected to the common circuit point of the emitters of the transistors 11 and 12 and the constant current source 15. A low-pass filter 16 is connected to the collector of the transistor 13 and has an output terminal 17 from which a demodulated output signal is obtained.

The operation of the F-M demodulator circuit illustrated in FIG. 1 will now be described in conjunction with the waveforms depicted in FIGS. 2A–2H. Let it first be assumed that a frequency modulated signal shown in FIGS. 2A and 2B is differentially applied to the base electrodes of the transistors 6 and 7. This signal has been clipped so that it is a rectangular wave, but the frequency modulation is still present in its periodicity. Initially, during a period $t_1$, the transistor 6 may be assumed to be conducting. By the usual differential operation, the transistor 7 will therefore be non-conducting. Let it further be assumed that the transistor 1 of the multivibrator is also conducting and, accordingly, the transistor 2 is non-conducting. This corresponds to base voltages illustrated in FIGS. 2E and 2F. Thus, in this assumed example, a collector-emitter current I flows through the transistor 1 from the source $+V_{cc}$, through the diode 4a, through the conducting transistor 6 and to the constant current source 9, which determines the magnitude of current I.

At the end of the interval $t_1$, the frequency modulated signal in FIG. 2B reverses polarity, causing the transistor 7 to become conductive by applying a potential to its base that is positive with respect to the potential at its emitter. At the same time the differentially applied frequency modulated signal shown in FIG. 2A will drive the transistor 6 to its non-conductive state. During the period $t_2$ a charging current $I_c$ shown in FIG. 2G flows from the source $+V_{cc}$, through the diode 4a, and through the collector-emitter circuit of the transistor 1 to charge the capacitor 3. This current also flows through the collector-emitter circuit of the conductive transistor 7 to the constant current source 9. The magnitude of the charging current $I_c$ is, therefore, equal to I, as determined by the constant current source 9. The voltage at the emitter of the conductive transistor 1 during the interval $t_2$ is $V_{cc} - V_{be}$, where $V_{be}$ is the base-emitter voltage of the transistor 1 and is also the voltage across the conducting diode 4a. The emitter voltage of the transistor 1 is held at this fixed value, as shown in FIG. 2C, but the voltage at the emitter of the transistor 2, as shown in FIG. 2D, decreases at a linear rate due to the charging of the capacitor 3 by a constant current.

The capacitor 3 will continue to be charged until the voltage at the emitter of the transistor 2 falls below the value $V_{cc} - 2V_{be}$, which is the value required to make the emitter of the transistor 2 negative with respect to its base, causing the transistor 2 to switch to its conductive state, and defining the end of the interval $t_2$. At that instant cross-coupling of the transistors 1 and 2 results in switching the transistor 1 to its non-conductive state. Since the transistor 2 is now conducting, the voltage appearing at its emitter rises immediately to the value $V_{cc} - V_{be}$. Since the voltage across the capacitor 3, which is $V_{cc} - V_{be} - (V_{cc} - 2V_{be}) = V_{be}$ cannot change instantaneously, the voltage at the emitter of the transistor 1 also rises rapidly to $V_{cc}$.

During the interval $t_3$, the collector-emitter current I flowing through the transistor 2 is directed from the source $+V_{cc}$, through the diode 4b, and through the collector-emitter circuit of the transistor 7 to the constant current source 9. As shown in FIG. 2G, the capacitor charging current during the interval $t_3$ is zero.

Let it now be assumed that, at the end of the interval $t_3$, the frequency modulated signal shown in FIGS. 2A and 2B and differentially applied to the transistors 6 and 7 drives the transistor 6 into its conducting state and, likewise, drives the transistor 7 into its non-conducting state. Accordingly, the respective conductive paths that are established result in a capacitor charging current $I'_c$ that flows to the capacitor 3 from the collector-emitter circuit of the transistor 2 and is equal to the current I, as represented in FIG. 2G. The negative polarity of the waveform representing $I'_c$ in FIG. 2G corresponds to the reversed direction of the flow of the current $I'_c$. Consequently, in a manner that is analogous to the described hereinabove, the voltage at the emitter of the transistor 1 decreases from its initial value of $+V_{cc}$ in accordance with the charging of the capacitor 3. This decrease in the emitter voltage of the transistor 1 occurs throughout the intervals $t_4$ and $t_5$, as illustrated in the waveform depicted in FIG. 2C. The rate of change of the voltage at the emitter of the transistor 1 is constant during the intervals $t_4$ and $t_5$, and the reason for separately identifying the intervals will be described hereinafter.

At the end of the interval $t_5$, the voltage at the emitter of the transistor 1 is sufficiently reduced so that the base-emitter voltage switches the transistor 1 back to its conductive state. In accordance with the multivibrator action, the transistor 2 is substantially simultaneously switched to its non-conductive state. Accordingly, the current I now flows from the source $+V_{cc}$ through the diode 4a, the collector-emitter circuit of the transistor 1, and the collector-emitter circuit of the transistor 6 to the constant current source 9. As may be observed from the waveforms of FIGS. 2A–2H, the F-M demodulator circuit is now back in its initial condition.

Let it now be assumed that the frequency of the F-M signal is varied for its next cycle, in accordance with the information modulated thereon, to a higher frequency. This causes the times during which the respective transistors 6 and 7 are conductive to be decreased from those just described. It is recognized that, as the duration of conductivity of the transistors is decreased, the corresponding duration which the capacitor remains fully charged to one polarity or the other is likewise decreased. Accordingly, the rate at which the capacitor charging current pulses recur is seen to vary directly as the frequency of the F-M signal. This relationship may be observed in FIG. 2G. The duration of each of the current pulses is fixed because the capacitance of the capacitor 3 is fixed and the charging current I, whether in the direction $I_c$ or in the direction $I'_c$, is held constant by the constant current circuit 9, and the voltage $V_{be}$ is assumed to remain constant. Thus, it should be noted that the waveforms produced in response to the increased frequency of the F-M signal are substantially similar in shape to the waveforms previously described and illustrated, although the frequency and corresponding intervals $t_6$ and $t_9$ are varied in a corresponding manner. Such waveforms are illustrated in FIGS. 2A–2G following the interval $t_5$.

The output signals produced at the terminals of the capacitor 3 in response to the capacitor charging currents applied thereto include pulse intervals proportional to the phase difference between the frequency modulated signal and the oscillating signal produced by the emitter-coupled multivibrator, as illustrated in FIGS. 2C and 2D. This phase difference is linearly related to the frequency of the frequency modulated signal. The signals at the capacitor terminals are coupled to and rectified by the bidirectional rectifier circuit 10 to obtain, at the collector electrode of the transistor 13, a signal that, in turn, is converted into a demodulated signal by the operation of the low-pass filter 16. The resultant demodulated output signal is provided at the output terminal 17. Alternatively, the low-pass filter may be replaced by an integrating circuit.

If the carrier of the F-M signal in FIGS. 2E and 2F is not frequency modulated, the phase difference between the conducting duration of the transistors 1 and 2 and the conducting duration of the respective transistors 6 and 7 is constant and equal to −90°. Generally, the conducting duration of the respective transistors 1 and 2 of the F-M demodulator circuit in accordance with the present invention is injection locked by the frequency modulated signal that has a frequency variation range of zero to $2F_o$, where $F_o$ is the center frequency of the frequency modulated carrier. Accordingly, the phase difference relationship and the frequency $F_o$ of the multivibrator, which relationship is dependent upon the conducting periods of the transistors 1 and 2 and the conducting periods of the transistors 6 and 7, may be represented in TABLE I as follows:

TABLE I

| f | φ |
|---|---|
| 0 | 0° |
| $F_o$ | −90° |
| $2F_o$ | −180° |

The phase difference between the F-M signal and the oscillating signal is linearly related to the frequency $f$ of the F-M signal as such frequency $f$ is varied between zero and $2F_o$. Therefore, if the voltages at the terminals of the capacitor 3 are rectified, the resultant modulated signal is linearly related to the F-M signal over a wide range of frequency variations.

The bidirectional rectifier 10 may also be considered to be a differential amplifier with the transistors 11 and 12 actings as two signal inputs. These transistors are differentially connected with respect to the transistor 13, the base of which is biased by a controllable direct voltage. The transistor 13 will be conductive as long as neither the signal applied to the base of the transistor 11 nor the signal applied to the base of the transistor 12 is greater than the reference voltage applied to the base of the transistor 13. The reference level is indicated in FIGS. 2C and 2D as being between $V_{cc} - V_{be}$ and $V_{cc}$. During the interval $t_3$, the potential on the emitter of the transistor 1 is substantially at the level $V_{cc}$ and thus is greater than the reference level. The base of the transistor 11 is connected directly to the emitter of the transistor 1 and so during the interval $t_3$ the transistor 11 is conductive. By differential operation the transistor 13 is non-conductive during the same interval.

Even when the voltage at the emitter of the transistor 1 starts to decrease during the interval $t_4$, the transistor 11 is still conductive until its base voltage reaches the reference level. This determines the end of the interval $t_4$, at which time the transistor 11 becomes non-conductive and the transistor 13, by differential operation, becomes conductive.

During the intervals $t_3$ and $t_4$ when the transistor 13 is non-conductive, there is no voltage drop across its load resistor 18, and thus the voltage at the collector of the transistor 13 during the intervals $t_3$ and $t_4$ is at the level of $V_{cc}$ as iindicated by the pulse $D_1$ in FIG. 2H.

During the interval $t_5$ when the capacitor 3 is being charged, the voltages at the bases of both of the transistors 11 and 12 remain below the reference level and so the transistor 13 remains conductive and its collector voltage is at a low value. As soon as conductivity is transferred from the transistor 2 to the transistor 1 at the end of the interval $t_5$, the voltage at the emitter of the transistor 2 rises to the level $V_{cc}$ as shown in FIG. 2D. This causes the transistor 12 to become conductive and the transistor 13 to become non-conductive, thereby initiating the leading edge of the second pulse $D_2$ in FIG. 2H. This pulse continues for the duration of the interval $t_6$ and the following interval $t_7$ that terminates when the voltage at the emitter of the transistor 2 drops to the reference level. Conductivity is then transferred to the transistor 13 following the termination of the pulse $D_2$ and lasting until the beginning of the pulse $D_3$, which commences when the transistor 2 again becomes conductive.

As may be seen, the duration of the pulses $D_1$, $D_2$, and $D_3$ is not constant but varies in accordance with the frequency of the frequency modulated signal applied to the transistors 6 and 7 and represented by FIGS. 2A and 2B. The intervals between the pulses $D_1 - D_3$ are all the same due to the fact that the charging time of the capacitor 3 is always constant under the assumed conditions of constant charging current and constant voltage $V_{be}$.

Passing the pulses $D_1 - D_3$ through the low-pass filter 16 filters out the sharp variations in voltage levels to a value indicated in FIG. 2H by the dotted line that represents the amplitude of the signal used to frequency modulate the carrier in the signal applied to the bases of the transistors 6 and 7. This completes the demodulation of the F-M signal.

Referring now to FIG. 3, there is schematically illustrated a further embodiment of the F-M demodulator circuit in accordance with the present invention. In the demodulator circuit presently described, wherein like reference numerals are used to identify like component parts previously described with respect to FIG. 1, the transistors 1 and 2 of the emitter-coupled multivibrator have their respective collector electrodes coupled to the source $+V_{cc}$ by the collector-emitter circuits of a pair of transistors 20 and 21, respectively. Additionally, the common circuit points defined by the transistors 1 and 20 and the transistors 2 and 21 are connected by two resistors 22 and 23 to the emitter of a further transistor 24. The collector of the transistor 24 is connected to the source $+V_{cc}$. The transistor 24 is provided with predetermined base bias potential by connection to a point B in a voltage divider network comprising series-connected resistors 25, 26, and 27 that extend between the source $+V_{cc}$ and the reference potential, such as ground. The base electrodes of the transistors 20 and 21 are connected in common relationship to a circuit point A between the series connection of resistors 26 and 27. Thus, a first predetermined bias potential appearing at the junction A is applied to the transistors 20 and 21. The voltage across the resistors 26 is defined as voltage $V_A$ and has a greater magnitude than the voltage $V_B$ across the resistor 25, alone.

The cross-coupling of the transistors 1 and 2 of the multivibrator is effected by a pair of transistors 28 and 29. In particular, the collector electrode of the transistor 1 is coupled to the base electrode of the transistor 2 by the PN junction established by the base-emitter circuit of the transistor 28. Similarly, the collector electrode of the transistor 2 is coupled to the base electrode of the transistor 1 by the PN junction established by the base-emitter circuit of the transistor 29. The transistors 28 and 29 have their collectors connected directly to the source $+V_{cc}$. The transistors 28 and 29 serve to prevent saturation of the transistors 1 and 2 during the respective conduction thereof, thereby increasing the switching speed of the transistors 1 and 2.

A multiplier circuit 30 is provided for deriving the output signal that is linearly phase related to the modulating frequency of the frequency modulated input signal. The multiplier circuit 30 includes a first set of input terminals 31 and 32 coupled to the bases of the multivibrator transistors 1 and 2 and a second set of input terminals 33 and 34 connected to the bases of the transistors 6 and 7 to be supplied with the frequency modulated signal.

The input terminals 33 and 34 are connected to the bases of the pair of differentially connected transistors 36 and 37, respectively. The emitters of these transistors are connected to a constant current source 38 which, in turn, is connected to ground. The collector of the transistor 36 is connected to the common emitter terminals of another pair of differentially connected transistors 39 and 40 and the collector of the transistor 37 is connected to a similar differentially connected pair of transistors 41 and 42. The bases of the transistors 39 and 41 are connected to the input terminal 31 of the multiplier circuit and the bases of the transistors 40 and 42 are connected to the input terminal 32. The collectors of the transistors 40 and 41 are connected directly together to the positive power supply $+V_{cc}$. The collectors of the transistors 39 and 42 are connected directly together to one end of a load resistor 43 the other end of which is connected to the power supply terminal $+V_{cc}$. A capacitor 44 is connected in parallel with the load resistor 43, and the common circuit point between the collectors of the transistors 39 and 42, the resistor 43, and the capacitor 44 is connected to an output terminal 45.

In order to describe the operation of the circuit in FIG. 3 it will be assumed that the transistors 1 and 7 are both conductive. This is true during the interval $t_2$ and the intervals $t_7$ and $t_8$ shown in FIG. 2. Current to charge the capacitor 3 will then flow along the path indicated by the dotted arrow 46 through the collector-emitter path of the transistor 20 as well as the collector-emitter paths of the transistors 1 and 7. Due to the voltage drop across the resistors 25 and 26, the voltage at the base of the transistor 20 will be $V_{cc} - V_A$. The base emitter voltage of all of the transistors is assumed to be substantially equal and is designated by $V_{be}$. Therefore, the voltage at the emitter of the transistor 20 is $V_{cc} - V_A - V_{be}$.

During intervals when current is drawn through the transistor 20, no current is drawn through the transistor 21. The voltage at the emitter of the transistor 24 is $V_{cc} - V_B - V_{be}$, which is positive with respect to the voltage $V_{cc} - V_A$ on the base of the transistor 21 and keeps the latter transistor nonconductive.

The emitter voltage on the transistor 28 is $V_{be}$ below the base voltage of the transistor and is thus equal to $V_{cc} - V_A - 2V_{be}$ since no current flows through the resistor 23 so that the emitter voltage of the transistor 24 is substantially equal to the base voltage of the transistor 29. Correspondingly, the emitter voltage of the transistor 29 is $V_{be}$ below the base voltage of that transistor, or $V_{cc} - V_B - V_{be}$. The latter voltage is also the base voltage of the transistor 1, and therefore the emitter voltage of that transistor is $V_{cc} - V_B - 3V_{be}$.

As the capacitor 3 charges, the voltage at its right hand terminal connected to the emitter of the transistor 2 will eventually reach a level at which the transistor 2 can become conductive. This level is $V_{be}$ below the base voltage, which is $V_{cc} - V_A - 2V_{be}$. At the instant that the voltage across the capacitor 3 reaches a level to cause the transistor 2 to become conductive, this capacitor voltage will be the difference between the voltages at the emitters of the transistors 1 and 2. This voltage difference is:

$$(V_{cc} - V_A - 3V_{be}) - (V_{cc} - V_B - 3V_{be}) = V_B - V_A$$

As will be noted, the base emitter voltage $V_{be}$, which is variable in response to changes in temperature, is eliminated, and the charging voltage $V_B - V_A$ can be maintained substantially independent of variations in the temperature of the circuit, thereby assuring that in each operating cycle the charging interval will always be the same since the constant charging current is determined by the constant current circuit 9, the capacitance of the capacitor 3 is constant, and the charging voltage is no longer dependent on the temperature-dependent voltage $V_{be}$.

When the transistor 2 does become conductive, multivibrator action causes the transistor 1 to become non-conductive. The bias conditions on the transistors 20 and 21 thus reverses as do the bias conditions on the transistors 28 and 29 and on transistors 1 and 2. Current is no longer drawn through the transistor 20, but instead the transistor 2 draws current through the transistor 21.

The frequency modulated signal illustrated in FIGS. 2A and 2B and applied to the bases of the transistors 6 and 7 is also applied to the transistors 36 and 37 in the multiplier circuit 30. Current flow through the latter two transistors is further determined by whether the transistors 39 and 41, to which the voltage shown in FIG. 2E is applied or the transistors 40 and 42, to which the voltage shown in FIG. 2F is applied, are conductive.

Current can flow along the path 48 when the transistors 36 and 39 are both conductive. The transistor 36 is conductive when the incoming frequency modulated signal shown in FIG. 2A is positive, and the transistor 39 is conductive when the signal at the base of the transistor 1, as shown in FIG. 2E, is positive. These conditions would be true during the interval $t_6$ in FIG. 2. Current could flow along the path 47 when the transistors 37 and 42 are both conductive. Transistor 37 is conductive when the frequency modulated signal shown in FIG. 2B is positive and the transistor 42 is conductive when the signal at the base of the transistor 2, as shown in FIG. 2F, is positive. These conditions coincide during the intervals $t_3$ and $t_9$ in FIG. 2. During the remaining intervals when the transistors 36 and 40 or the transistors 37 and 41 are conductive, current does not flow in the load resistor 43. These intervals would be the spacing intervals between current pulses as a pulsating current is drawn through the load resistor 43. This pulsating current is smoothed by the capacitor 44 so that the output voltage at the terminal 45 has a magnitude that varies according to the repetition rate of the pulses, and the filtering action causes the resulting voltage at the terminal 45 to correspond to the modulating signal of the frequency modulated signal from the source 8.

While the present invention has been particularly shown and described with reference to exemplary embodiments thereof, it will be obvious to those of ordinary skill in the art, that various changes and modifications in form and in details may be made without departing from the spirit and the scope of the invention.

For example, although NPN transistors have been illustrated herein, it is manifest that other types of transistors are contemplated for the disclosed F-M demodulator circuit. Similarly, a source of negative DC potential may be provided to energize the demodulator circuit. It is therefore intended that the appended claims be interpreted as including all such changes and modifications.

What is claimed is:

1. An F-M demodulator circuit comprising:
    a multivibrator circuit for producing an oscillating signal and comprisinng first and second current switching devices each having an input electrode and output electrodes, the input electrode of at least one of said devices being connected to one of the output electrodes of the other of said devices, and a capacitor interconnecting the remaining output electrodes of said first and second devices;
    first and second transistors connected in series with the output electrodes of said first and second switching devices, respectively;
    a third transistor;
    first and second impedances connecting the emitter of said third transistor to the emitters of said first and second transistors, respectively, the collector of said third transistor being connected to a source of operating voltage;
    bias voltage means supplying a first bias voltage to the base of said third transistor and a second bias voltage in common to the bases of said first and second transistors;
    a differential amplifier comprising a pair of output terminals and a pair of input terminals, said pair of output terminals being connected to said remaining output electrodes of said first and second current switching devices, and said pair of input terminals receiving a frequency modulated signal differentially applied thereto; and
    means connected with said multivibrator circuit and said differential amplifier for providing a demodulated output signal having an amplitude proportional to the phase difference between said frequency modulated signal and said oscillating signal, and hence, linearly related to the modulating frequency of said frequency modulated signal.

2. An F-M demodulator circuit in accordance with claim 1 in which said means for providing the demodulated output signal comprises a bidirectional rectifier circuit coupled to said remaining output electrodes of said first and second current switching devices.

3. An F-M demodulator circuit in accordance with claim 2 wherein said bidirectional rectifier circuit comprises:
    A. first and second amplifying devices, each having an input terminal coupled to the respective remaining output electrodes of said current switching devices, said first and second amplifying devices further comprising an output terminal and a common terminal, the output and common terminals of said first amplifying device being connected in parallel with the output and common terminals of said second amplifying device; and
    B. a third amplifying device having a reference voltage input terminal, an output terminal, and common terminal, said common terminal being connected directly to said common terminals of said first and second amplifying devices whereby said third amplifying device is differentially connected with respect to said first and second amplifying devices.

4. An F-M demodulator circuit in accordance with claim 3 comprising, in addition, a load impedance connected in series with said output terminal, whereby current flows through said load impedance substantially only when the voltage at each of said input terminals of said first and second amplifying devices is less than the voltage applied to said reference voltage input terminal of said third amplifying device.

5. An F-M demodulator circuit in accordance with claim 2 comprising, in addition, a low-pass filter circuit connected to the output of said bidirectional rectifier circuit.

6. An F-M demodulator circuit in accordance with claim 1 in which said input electrode of each said current switching device is connected to said one output electrode of the other current switching device through a PN junction.

7. An F-M demodulator circuit in accordance with claim 1 in which said means for providing the demodulated output signal comprises a multiplier circuit comprising:
A. first input terminals connected to the input electrodes of said first and second current switching devices;
B. second input terminals connected to said input terminals of said differential amplifier for receiving said frequency modulated signal; and
C. output terminals for deriving thereat said demodulated output signal.

8. An F-M demodulator circuit in accordance with claim 1 wherein said multivibrator means is in the form of an emitter-coupled multivibrator circuit having cross-coupled transistors so as to be alternately conductive and means to prevent the saturation of each of said transistors during the respective conduction thereof.

* * * * *